United States Patent
Brueckner et al.

(10) Patent No.: US 8,142,989 B2
(45) Date of Patent: *Mar. 27, 2012

(54) TEXTURED CHAMBER SURFACE

(75) Inventors: Karl Brueckner, Santa Clara, CA (US); Brian West, San Jose, CA (US); Hong Wang, Cupertino, CA (US)

(73) Assignee: Quantum Global Technologies LLC, Dublin, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/618,693

(22) Filed: Nov. 13, 2009

(65) Prior Publication Data

US 2010/0059366 A1  Mar. 11, 2010

Related U.S. Application Data

(63) Continuation of application No. 10/863,151, filed on Jun. 7, 2004, now Pat. No. 7,618,769.

(51) Int. Cl.
*G03F 7/00* (2006.01)
(52) U.S. Cl. ......... 430/331; 430/313; 430/320; 430/322
(58) Field of Classification Search .................. 430/322, 430/313, 320, 331; 451/38, 36, 39, 40, 41, 451/57
See application file for complete search history.

(56) References Cited

U.S. PATENT DOCUMENTS

| | | |
|---|---|---|
| 3,482,082 A | 12/1969 | Isreeli |
| 4,913,784 A | 4/1990 | Bogenschutz et al. |
| 5,064,511 A | 11/1991 | Gobetti |
| 5,228,245 A | 7/1993 | Rice et al. |
| 5,391,275 A | 2/1995 | Mintz |
| 5,401,319 A | 3/1995 | Banholzer et al. |
| 5,460,694 A | 10/1995 | Schapira et al. |
| 5,474,649 A | 12/1995 | Kava et al. |
| 5,695,825 A | 12/1997 | Scruggs |
| 5,910,338 A | 6/1999 | Donde |
| 5,916,454 A | 6/1999 | Richardson et al. |
| 6,150,762 A | 11/2000 | Kim et al. |
| 6,227,435 B1 | 5/2001 | Lazarz et al. |
| 6,250,251 B1 | 6/2001 | Akiyama et al. |
| 6,306,226 B1 | 10/2001 | Iino et al. |
| 6,423,175 B1 | 7/2002 | Huang et al. |
| 6,506,312 B1 | 1/2003 | Bottomfield |
| 6,558,505 B2 | 5/2003 | Suzuki et al. |
| 6,623,597 B1 | 9/2003 | Han et al. |
| 2002/0086118 A1 | 7/2002 | Chang et al. |
| 2003/0047464 A1 | 3/2003 | Sun et al. |
| 2003/0173526 A1 | 9/2003 | Popiolkowski et al. |
| 2004/0056211 A1 | 3/2004 | Popiolkowski et al. |
| 2005/0048876 A1 * | 3/2005 | West et al. ................... 451/37 |

* cited by examiner

*Primary Examiner* — Thorl Chea
(74) *Attorney, Agent, or Firm* — Fox Rothschild LLP

(57) ABSTRACT

A method of fabricating a process chamber component having a textured surface with raised features. The method comprises providing a process chamber component having a surface, and forming a patterned resist layer on the process chamber component, the patterned resist layer having apertures that expose portions of the surface of the process chamber component therethrough. A textured surface having raised features is formed on the process chamber component by propelling grit particles with a gas that is pressurized to a pressure sufficiently high to cause the grit particles to erode and remove material from the surface.

8 Claims, 6 Drawing Sheets

TEXTURED CHAMBER SURFACE

CROSS REFERENCE

The present application is a continuation of U.S. patent application Ser. No. 10/863,151, filed on Jun. 7, 2004, which is incorporated herein by reference in its entirety.

BACKGROUND

In the processing of substrates such as semiconductor wafers and displays, a substrate is placed in a process chamber and exposed to an energized gas to deposit or etch material on the substrate. During such processing, process residues are generated and can deposit on internal surfaces in the chamber. For example, in sputter deposition processes, material sputtered from a target for deposition on a substrate also deposits on other component surfaces in the chamber, such as on deposition rings, shadow rings, wall liners, and focus rings. In subsequent process cycles, the deposited process residues can "flake off" of the chamber surfaces to fall upon and contaminate the substrate. To reduce the contamination of the substrates by process residues, the surfaces of components in the chamber can be textured. Process residues adhere to the textured surface and inhibit the process residues from falling off and contaminating the substrates in the chamber.

In one version, the textured component surface is formed by directing an electromagnetic energy beam onto a component surface to form depressions and protrusions to which process deposits adhere. An example of such a surface is a "Lavacoat™" surface, as described for example in U.S. patent application Ser. No. 10/099,307 to Popiolkowski et al, filed on Mar. 13, 2002 and published as U.S. Patent Application Publication No. 2003-0173526 on Sep. 18, 2003, and U.S. patent application Ser. No. 10/622,178 to Popiolkowski et al, filed on Jul. 17, 2003 and published as U.S. Patent Application Publication No. 2004-0056211 on Mar. 25, 2004, both commonly assigned to Applied Materials, Inc, and both of which are incorporated herein by reference in their entireties. However, a problem that can arise with such surfaces is that the process to create the surfaces can be prohibitively expensive, due to for example the requirements of the electromagnetic energy beam source, and can require a degree of accuracy in the scanning of the beam that can be difficult to achieve.

In another version, the textured component surfaces can comprise raised horizontal surfaces formed by providing a patterned photoresist mask on a surface and etching through the openings in the pattern, as described for example in U.S. Pat. No. 6,506,312 to Bottomfield, issued Jan. 14, 2003, which is herein incorporated by reference in its entirety. The raised horizontal surfaces formed by this method have inner angles that trap and secure loose process deposits. For example, the raised horizontal surfaces can comprise a star pattern that provides relatively sharp angles to accumulate process deposits. The horizontal raised surfaces can also have sharp angles at top corners formed between the top of the raised surfaces and the surface sidewalls. However, a problem with such textured surfaces is that a build-up of process residues can cause stresses in the angled surfaces, which can result in cracking and erosion of the textured surface, including cracking of the edges of the horizontal raised surfaces.

Accordingly, it is desirable to have a component comprising a textured surface that provides reliable processing results substantially without contaminating substrates. It is further desirable to have a method of fabricating a component having a textured surface that is substantially repeatable to provide consistent processing results. It is also desirable to have a component having a textured surface that is resistant to erosion and stresses caused by deposited process residues, and a method of fabricating such a component.

SUMMARY

A method of fabricating a process chamber component having a textured surface with raised features. The method comprises providing a process chamber component having a surface and forming a patterned resist layer on the process chamber component, the patterned resist layer having apertures that expose portions of the surface of the process chamber component therethrough. A textured surface having raised features is formed on the process chamber component by propelling grit particles with a gas that is pressurized to a pressure sufficiently high to cause the grit particles to erode and remove material from the surface.

A component fabricated by the method comprises a chamber enclosure wall, chamber shield, target, cover ring, deposition ring, support ring, insulator ring, coil, coil support, shutter disk, clamp shield or substrate support.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
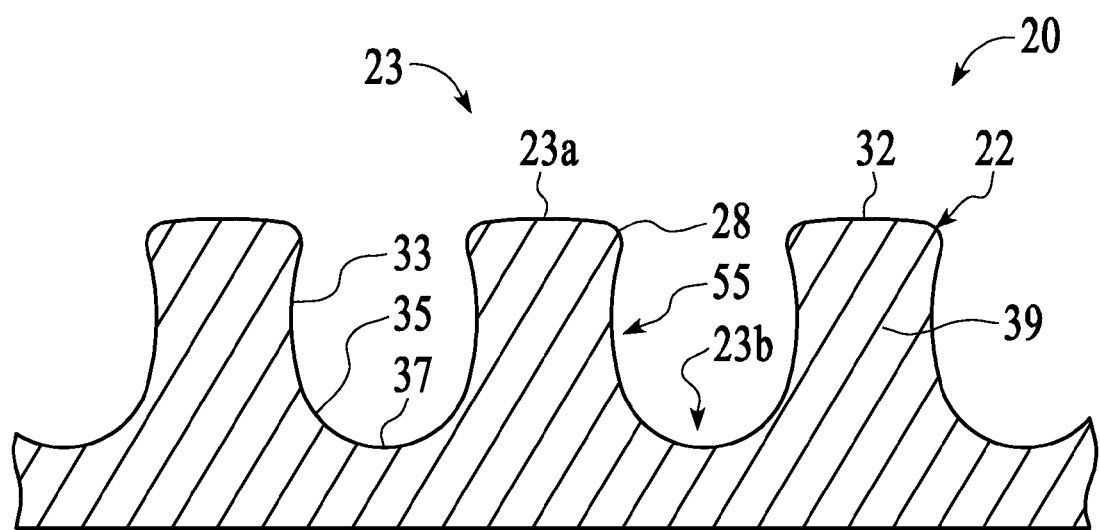
FIG. 1 is a schematic side view of an embodiment of a process chamber component having a textured surface.

A process chamber component 20 capable of being used in a substrate processing chamber 106 comprises a textured surface 22, as shown for example in FIG. 1. The textured surface 22 is a relatively "sticky" surface having features 23 such as raised features 23a and depressions 23b, to which process deposits can adhere to reduce the contamination of the substrates 104 by the process deposits. Chamber components 20 having the textured surface 22 can include, for example, a portion of a gas delivery system 112 that provides process gas in the chamber 106, a substrate support 114 that supports the substrate 104 in the chamber 106, a gas energizer 116 that energizes the process gas, chamber enclosure walls 118 and shields 120, and a gas exhaust 122 that exhausts gas from the chamber 106.

Figure 5:
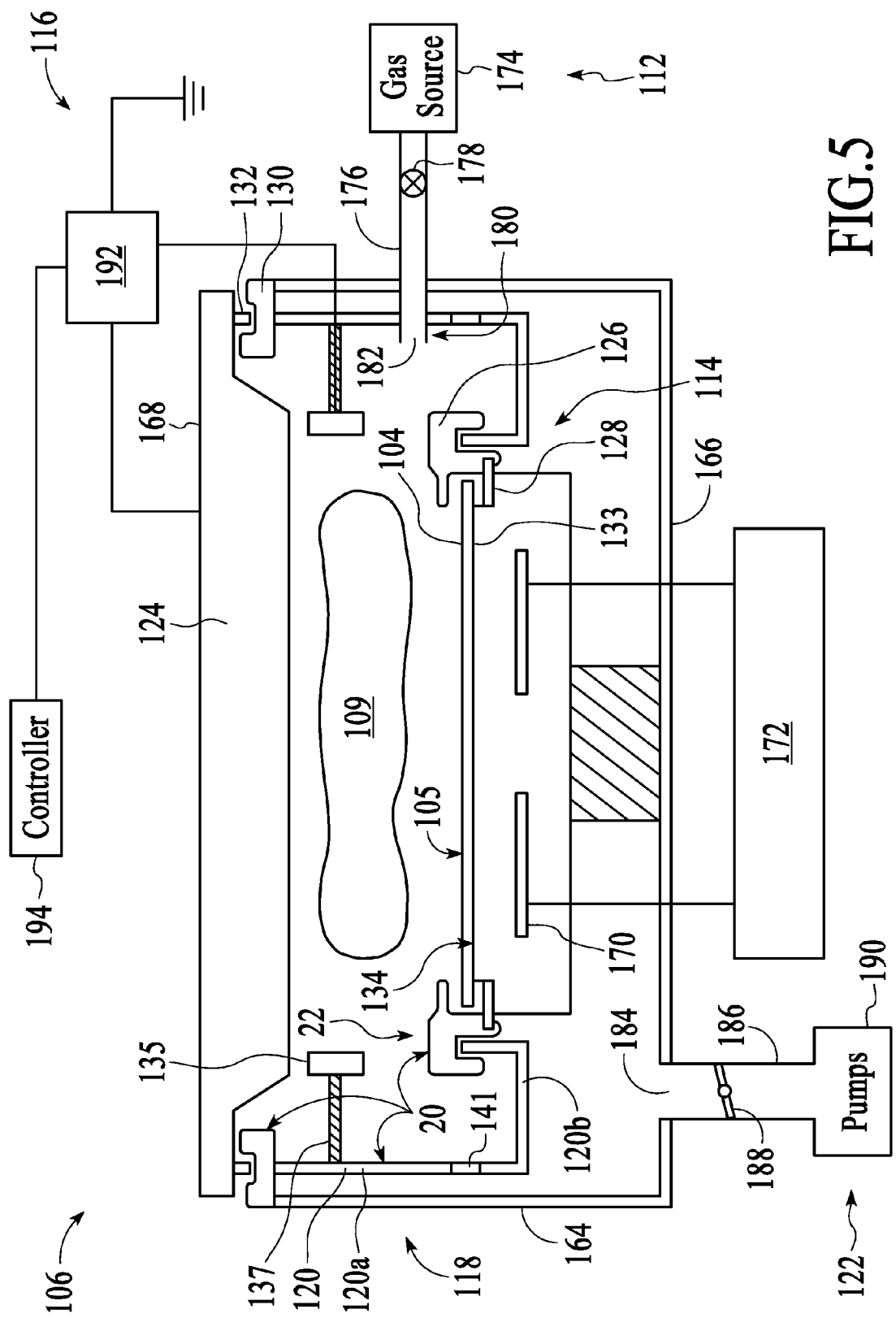
FIG. 5 is sectional side view of an embodiment of a sputter deposition chamber having a component with a textured surface.

Referring to FIG. 5, which illustrates an exemplary version of a physical vapor deposition chamber 106, components 20 having the textured surface 22 can include a chamber enclosure wall 118, a chamber shield 120, a target 124, a cover ring 126, a deposition ring 128, a support ring 130, insulator ring 132, a coil 135, coil support 137, shutter disk 133, clamp shield 141, and a surface 134 of the substrate support 114. The components 20 having the textured surface 22 can also comprise components of chambers such as etching chambers, pre-clean chambers, ashing chambers, CVD chambers, and other chambers. The textured surface 22 of the components 20 can comprise a metal material, such as at least one of titanium, stainless steel, copper, tantalum, tungsten, and aluminum. The textured surface 22 can also comprise ceramic materials, such as at least one of aluminum oxide, aluminum nitride, silicon nitride, silicon oxide, quartz, silicon carbide, yttrium oxide, zirconium oxide and titanium oxide.

The textured surface 22 desirably comprises a plurality of surface features 23 that have very few sharp edges and corners, and can even comprise features 23 that are substantially absent sharp edges and corners, as shown for example in FIG. 1. Sharp corners and edges, such as for example a top corner 28 of a raised features 23a, can be problematic because the corners and edges can build up stresses with the accumulation of process deposits on the texture surface 22 during processing. These stresses can lead to cracking and flaking of portions of the surface 22, such as the top corners 28 of the raised features 23a, as the accumulated residues build up pressure against the relatively fragile corners. Cracking and flaking of the portions of the textured surface 22 can lead to contamination of substrates by loose particles from the surface 22.

In contrast, features 23 having more smoothly sloped and rounded edges and corners, such as rounded top corners 28 of the raised features 23a, are more resistant to the stresses caused by the build-up of process deposits. The rounded top corners 28 are substantially absent sharp and fragile edges that could otherwise break off under the accumulated stresses. Instead, the raised features 23a have feature sidewalls 33 that smoothly transition to a top wall 32 of each feature 23a, substantially without forming a sharp vertex intersecting the sidewall 33 and top wall 32, to provide a sloped and rounded top corner 28. Thus, the raised features 23a have top walls 32 that have a substantially convex shape, with the edges of the top walls 32 sloping downwardly into the rounded top corners 28. The fracturing of the textured surface 22 can also be reduced by providing rounded bottom corners 35 of the raised features 23a, where a sidewall 33 of the raised feature 23a and a bottom wall 37 of the depression 23b meet. The rounded bottom corners similarly reduce stresses by providing a smoothly sloped corner that better accommodates process deposits. Accordingly, it is desirable to provide features 23 having smoothly sloped and rounded edges and corners to improve the integrity of the component surface 22 and reduce contamination of processed substrates 104.

In one version, the textured surface 22 can be formed by patterning a surface 22 of a component 20 via a patterned mask 25, as shown for example in FIGS. 2a-d and 4. The patterned mask 25 is placed over the surface 22 of the component 20 and apertures 26 are formed therein having a predetermined pattern 27. The patterned mask 25 is used to transfer a predetermined pattern 27 onto the underlying surface 22 of the component 20, for example by etching portions of the underlying surface 22 exposed through the apertures 26, or by depositing material onto the surface 22 through the apertures 26. The apertures 26 can be sized and shaped to transfer a desired and predetermined pattern 27 of features 23 onto the surface of the component 20.

In one version, the mask 25 comprises a patterned resist layer 24 that transfers a predetermined pattern 27 onto the underlying surface 22 of the component 20 via etching of the surface 22. The resist layer 24 comprises a material that is resistant to etching and has an etching rate that is lower than the etching rate of the underlying component surface 22. In this version, as shown for example in FIG. 2a, a resist layer 24 is deposited on the underlying surface 22 of the component 20. A predetermined pattern 27 of apertures 26 is then formed in the resist layer 24 that exposes portions 29 of the component surface 22, as shown for example in FIG. 2b. An etching step can then be performed to etch the exposed portions 29 of the underlying surface 22 to form a textured surface 22, as shown for example in FIG. 2c.

In one version, the resist layer 24 comprises a photoresist material, such as for example organic photoresist, that undergoes a change in material properties upon exposure to radiation such as UV or other radiation. Typically, the exposed portions of the photoresist undergo a change in solubility, rendering the exposed portions of the photoresist either more or less soluble in a developing solution, according to the type of photoresist being used. Once the photoresist has been exposed, the photoresist is developed to remove the more soluble portions, yielding a resist layer 24 comprising a predetermined pattern 27 of apertures 26. The photoresist can be developed, for example, by exposing the resist layer 24 to a chemical solution that removes the more soluble portions of the exposed resist layer 24. The shapes and sizes of the areas exposed on the resist layer 24 can be selected to provide a predetermined pattern 27 of apertures 26 having the desired apertures sizes, shapes and spacing.

Figure 2A:
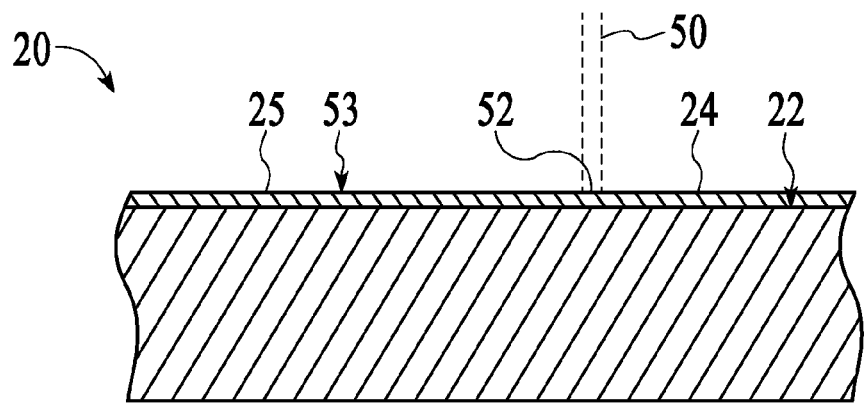
FIG. 2a is a schematic side view of an embodiment of a process chamber component having an overlying mask.
Figure 2B:
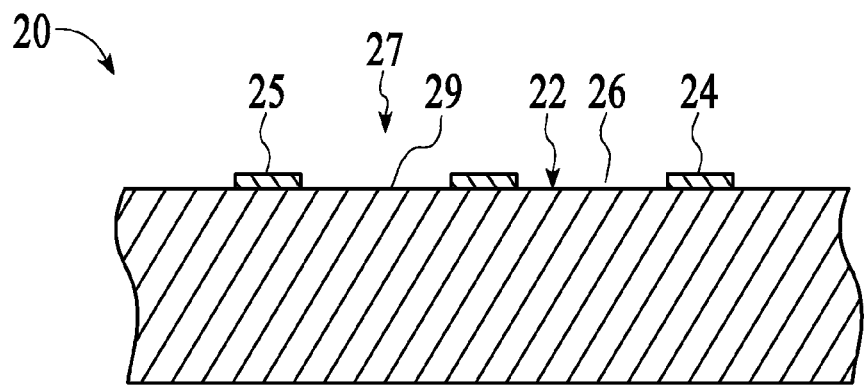
FIG. 2b is a schematic side view of an embodiment of the process chamber component of FIG. 2a after the overlying mask has been patterned.

In one version, the resist layer 24 comprising the photoresist material is patterned via exposure to a beam 50 of electromagnetic radiation, such as for example, a laser beam or an electron beam. For example, as shown in FIG. 2a, the electromagnetic energy beam can be directed onto a surface region 52 of the resist layer 24 to expose the region 52, such as a region where an aperture 26 is to be formed. In one version, the electromagnetic energy beam 50 comprises a cylindrical beam 50 that exposes a substantially circular region 52 on the resist layer 24 and forms a substantially circular aperture 26 in the resist layer 24. A substantially circularly-shaped aperture 26 may be desirable because the aperture provides for the formation of features having smooth walls with fewer sharp corners and edges. A predetermined pattern 27 of apertures 26 in the layer 24 can be formed by scanning the electromagnetic energy beam 50 across the surface 53 of the resist layer 24 to expose surface regions 52 corresponding to the desired predetermined pattern 27. For example, scanning of the beam 50 can be controlled by a computer controller having computer program code adapted to expose the layer 24 according to the predetermined pattern 27. The resist layer 24 is then developed, for example with a chemical developing solution, to provide a resist layer 24 having a predetermined pattern 27 of apertures 26.

In yet another version, an electromagnetic energy beam 50 can be directed onto the surface 53 of the resist layer 24 to form apertures 26 in the layer 24 by ablating the resist material. In this version, the resist layer 24 desirably comprises a material that can be readily ablated or bored by an electromagnetic energy beam 50, such as for example a material comprising at least one of a polymer, metal, and ceramic material. For example, the resist layer 24 can comprise a layer of metal material formed on the component surface 22, such as an electroplated metal layer, that can be ablated by the electromagnetic energy beam. As another example, the resist layer 24 can comprise an anodized layer of material that is formed on a metal component surface 22, such as a layer of anodized aluminum formed on an aluminum component surface 22. The electromagnetic energy beam 50 is directed onto a surface region 52 of the resist layer 24 at an intensity level that is sufficiently high to ablate and form a hole in the resist layer material, thereby providing an aperture 26 that exposes the underlying component surface 22. The electromagnetic energy beam 50 can comprise a cylindrical beam 50 that exposes a substantially circular region 52 on the resist layer 24 to form a substantially circularly-shaped aperture 26 in the resist layer 24. The electromagnetic energy beam 50 can be scanned across the surface 53 of the resist layer 24 to ablate surface regions 52 corresponding to apertures 26 in the predetermined pattern. Once the predetermined pattern 27 of apertures 26 have been formed the component 20 can be cleaned, for example with a cleaning solvent, to remove any loose resist particles remaining on the component 20 from the patterning process.

Figure 2C:
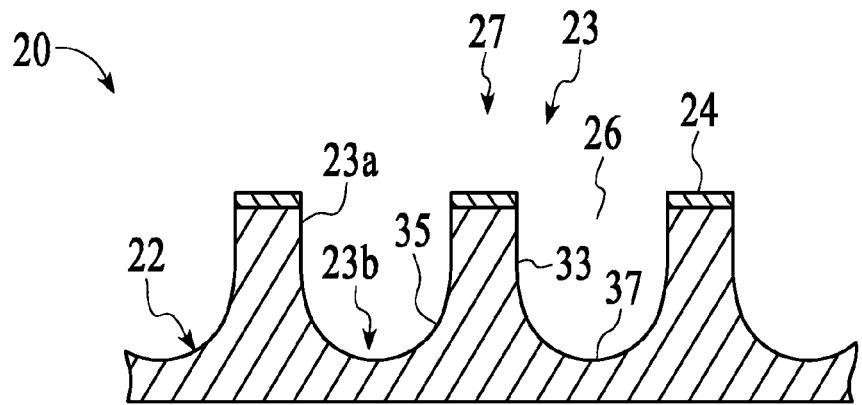
FIG. 2c is a schematic side view of an embodiment of the process chamber component of FIG. 2b after etching a surface of the component.

Once the patterned mask 25 has been formed, the portions 29 of the underlying surface 22 that are exposed through the apertures 26 can be etched in an etching step to form the textured exposed surface 22, as shown for example in FIG. 2c. In one version, the surface 22 is etched by exposing the surface to a liquid etching solution comprising etching species, for example by at least partially immersing the surface 22 in the etching solution. The etching solution is capable of etching material from the surface 22 of the component by chemically reacting with or otherwise removing material from the surface. Suitable etching solutions may be selected according to the composition of the surface 22 as well as the desired rate and other etching characteristics. For example, for a surface 22 comprising aluminum, a suitable etching solution may comprise at least one of HF, $H_2SO_4$ and HCl. As another example, for a surface 22 comprising copper, a suitable etching solution may comprise $H_3PO_4$. A suitable etching solution for a surface 22 comprising stainless steel may comprise, for example, ferric chloride. The surface 22 can also be etched by exposing the surface 22 to an energized etching gas such as an RF or microwave energized etching gas.

Etching of the surface 22 forms features 23 comprising depressions 23b at regions where the surface 22 is exposed through the apertures 26, and adjacent raised features 23a at regions covered by the overlying resist layer 24. Thus, the etching step at least partially transfers the pattern of the mask 25 onto the surface 22 to form a textured surface 22 having a predetermined pattern 27 of features 23. The features 23 etched in the surface 22 may comprise depressions 23b having a depth of from about 0.0254 millimeters (0.001 inches) to about 1.524 millimeters (0.050 inches), and may provide a textured surface 22 have an average surface roughness of from about 12.7 micrometers (500 microinches) to about 508 micrometers (20,000 microinches.)

The etching conditions maintained during the etching step can be also selected to provide etched features 23 on the surface 22 having desired sizes and shapes. For example, etching conditions can be selected to provide a desired height and width of the raised features 23a. The etching conditions can also be selected to provide rounded bottom corners 35, for example by selecting etching conditions that reduce etching of the feature sidewalls 33 when a desired depth of a depression 23b is obtained to provide sidewalls 33 that gradually slope downwardly towards the bottom wall 37. The rounded bottom corners 35 can reduce stresses resulting from the accumulation of deposited residues. The etching conditions can also be selected to provide a desired sidewall profile, such as the profile shown in FIG. 1 which has sidewalls 33 that form arcs 55 that curve into the raised feature 23a and that extend from a top corner 28 of the raised feature 23a to a bottom corner 35 of the raised feature 23a. The curved sidewall 33 forms raised features 23a having a width that tapers from a first width at the top corner 28 to a second width that is smaller than the first at a point below the top corner 28, such as at the midpoint 39 of the feature height, and back to a larger bottom width at about the bottom corner 35 of the raised feature 23a. For example, the first width at the top corner 28 may be from about 0.254 mm (0.010 inches) to about 2.54 mm (0.100 inches), the second width may be from about 0.152 mm (0.006 inches) to about 2.29 mm (0.090 inches), and the bottom width may be from about 0.254 mm (0.010 inches) to about 2.54 mm (0.100 inches.) The gradually curved sidewall 33 forms a curved pocket that retains process residues, without building up excessive stresses on the features 23. Etching conditions that can be selected to provide the desired feature shapes and sizes can comprise, for example, at least one of the etching solution composition, concentration, temperature, and etching duration. A suitable textured surface 22 may comprise raised features 23a having a height of, for example, from about 0.254 mm (0.010 inches) to about 3.81 mm (0.150 inches), and a spacing between the raised features 23a, as measured from the center of each raised feature 23a, of from about 0.254 mm (0.01 inches) to about 4.06 mm (0.160 inches.)

Figure 2D:
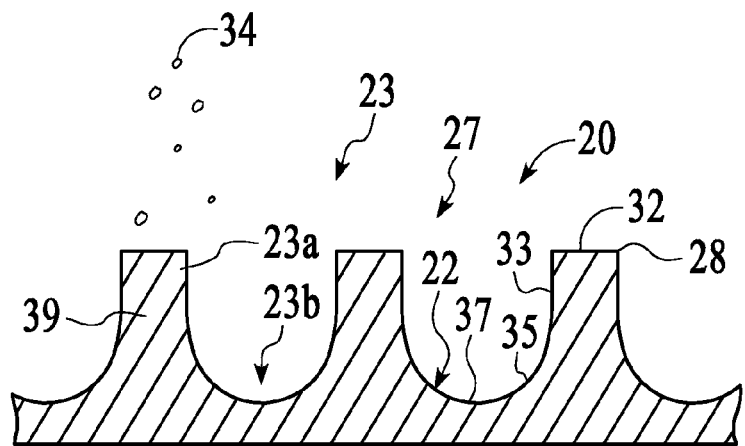
FIG. 2d is a schematic side view of an embodiment of the process chamber component of FIG. 2c after the overlying mask has been removed.

Once the textured surface 22 of the component 20 has been formed, the patterned mask 25 can be removed from the surface 22 to expose substantially the entire surface 22, as shown for example in FIG. 2d. A patterned mask 25 comprising a resist layer 24 can be removed from the surface 22 by cleaning the layer 24 from the surface 22. For example, for a resist layer 24 comprising organic photoresist, the layer 24 can be removed in an ashing process that provides an oxygen-containing gas that can be energized to react with carbon in the organic photoresist and form a gaseous $CO_x$ product that is exhausted from the chamber. The resist layer 24 can also be removed with a cleaning solution that is capable of cleaning the resist material from the surface, substantially without removing material from the underlying surface 22 of the component 20. A suitable cleaning solution can comprise, for example, at least one of $H_2SO_4$ and $H_2O_2$, and can even comprise a solution of N-methyl-2-pyrrolidone suitable for removing organic resist. The resist layer 24 can also be removed by other methods, such as for example by one or more of blasting the surface with grit particles, pressurized $CO_2$, and high pressure water jets.

A treatment step is performed to shape the raised features 23a to substantially remove sharp edges and corners from the features 23a, as for example in the raised features 23a of the textured surface 22 shown in FIG. 1. For example, the treatment step can be performed to form rounded top corners 28 on the raised features 23a. Removing the sharp edges and corners of the raised features 23a can help reduce the cracking and flaking of portions of the surface 22, such as the corners 28 of the raised surfaces 28, to reduce the contamination of processed substrates 104.

In one version, the raised features 23a are shaped by performing a grit blasting process that propels grit particles 34 at the surface 22 of the component 20, as shown for example in FIG. 2d. In the grit blasting process, a stream of hard grit particles 34 is propelled toward the surface 22 of the component 20 by gas that is pressurized to a pressure sufficiently high to cause the grit particles to erode and remove material from the surface 22. For example, a suitable pressure may be from about 34 kPa (5 PSI) to about 621 kPa (90 PSI). The grit particles 34 desirably comprise a material having a hardness that is higher than that of the surface 22. For example, the grit particles 34 can comprise at least one of aluminum oxide, garnet, silicon oxide and silicon carbide, and can have a particle size of from about 24 grit to about 120 grit, such as from about 715 micrometers to about 116 micrometers. The grit blasting process erodes away sharp edges and corners of the raised features 23a such as the top corners 28, by blasting material off of the corners, thereby providing top corners 28 that are more smoothly sloped and rounded, as shown for example in FIG. 1. The grit blasting process can also remove any remaining portions of the resist layer 24, and can texture portions of the component surface 22, such as surfaces on the top walls 32, sidewalls 33 and bottom walls 27 of the features 23, to improve adhesion of deposited materials to the surface 22.

Figure 3:
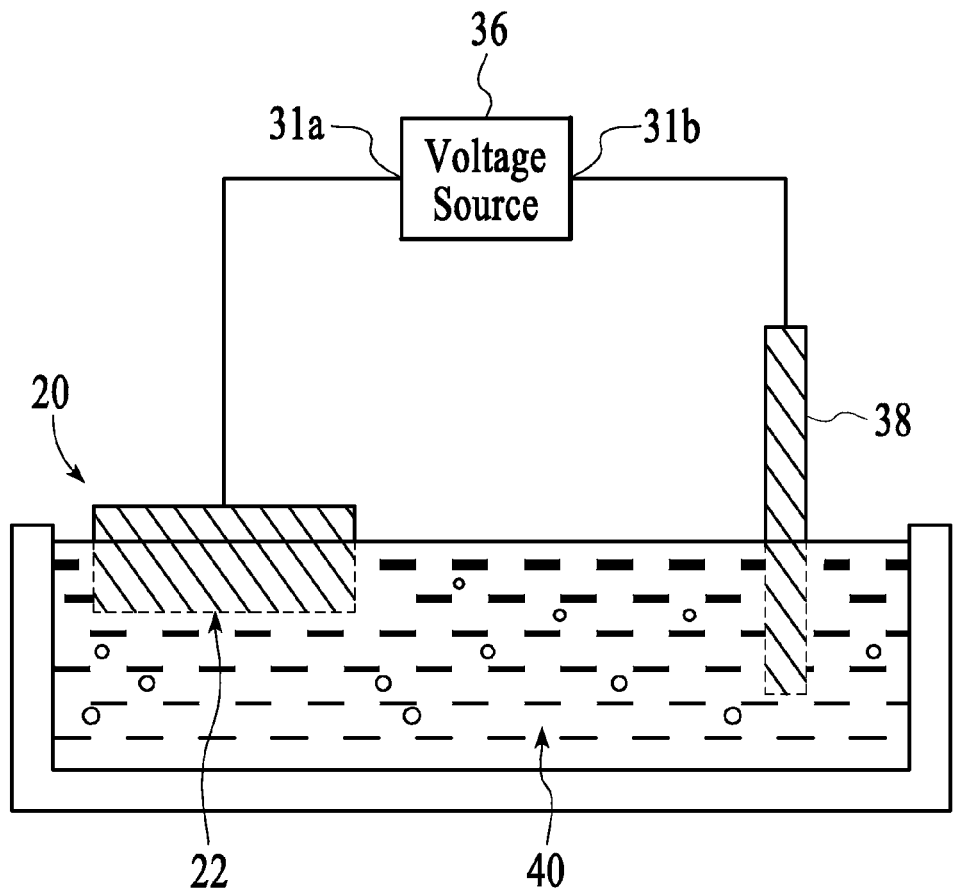
FIG. 3 is a schematic side view of an embodiment of an electrochemical graining apparatus.

In another version, the raised features 23a are shaped by performing an electrochemical graining process. In one version of an electrochemical graining process, the surface 22 of the component 20 is immersed in an electrochemical graining bath 40 comprising an electrochemical graining solution, as shown for example in FIG. 3. The electrochemical graining solution comprises an electrolyte solution that can comprise components capable of etching material from the surface 22. For example, the solution can comprise an acidic solution, such as an aqueous solution comprising at least one of HCl, $HNO_3$, and $H_3PO_4$. The component 20 is connected to a terminal 31a of a voltage source 36. A separate electrode 38 is connected to another terminal 31b of the voltage source 36 and is also immersed in the bath 40. The voltage source 30 applies a voltage to the surface 20 to pass a current, such as an AC current having a predetermined waveform, between the metal surface 20 and electrode 38. Applying the voltage while immersing the surface 22 in the electrochemical graining solution results in the etching away of material from portions of the surface 22 to erode areas of the surface 22, such as the top corners 28, to form rounded top corners 28 such as those shown in FIG. 1. The electrochemical graining process can also further texture the surface 22 to improve the adhesion of residues to the surface 22 by finely pitting the textured surface 22, such that fine recesses are formed in the surface 22 at intervals along the surface 22. The electrochemical graining process conditions, such as the voltage applied to the surface 22, the current, the pH of the electrochemical graining solution, and the temperature of the solution, are desirably maintained to provide the desired erosion and texturing of the surface 22 to form the rounded top corners 28.

In one version of an electrochemical graining process, a surface 22 comprising aluminum is electrochemically grained to form the rounded top corners 28 by immersing the surface 22 in a solution comprising HCl, and passing an AC current by applying a voltage of from about 5 Volts to about 50 Volts to provide a current density of from about 807 Amps/$m^2$ (75 Amps/$ft^2$) to about 2691 Amps/$m^2$ (250 Amps/$ft^2$) while maintaining a temperature of the electrochemical graining solution of from about 30° C. to about 100° C. An example of an electrochemical graining process having process conditions that may be suitable for texturing the surface 22 is described in U.S. Patent Application Publication No. 2003/0047464 to Sun et al, published on Mar. 13, 2003 and commonly assigned to Applied Materials, which is herein incorporated by reference in its entirety.

Figure 4:
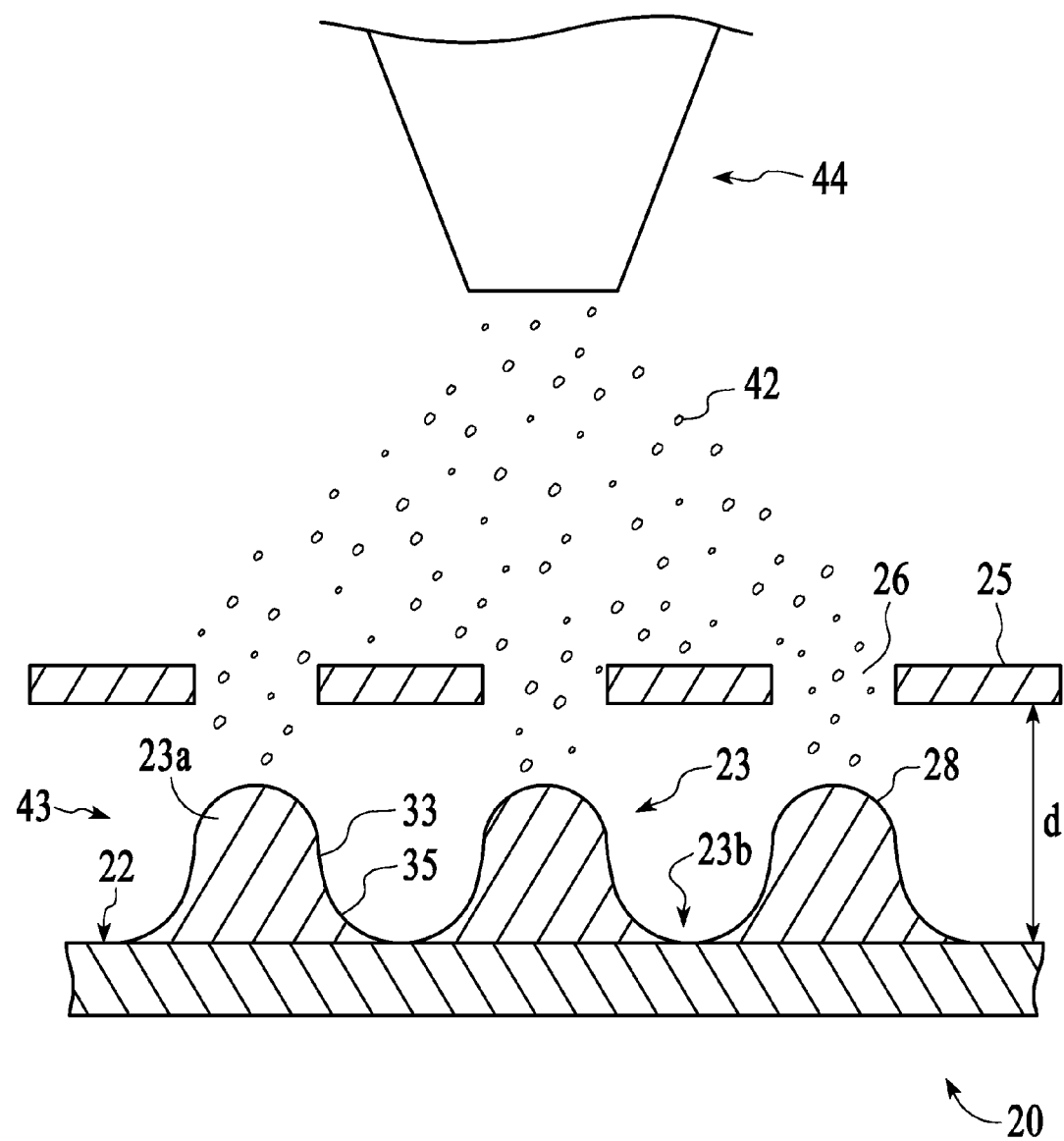
FIG. 4 is a schematic side view of an embodiment of a component having a textured surface formed by depositing material through a patterned mask.

In yet another method of forming a textured surface 22 having rounded top corners 28, the raised features 23a are formed on a component surface 22 by spraying a material onto the surface 22, as shown for example in FIG. 4. In this version, a patterned mask 25 can be arranged above the surface 22 of a component 20. A gap 43 is preferably provided between the surface 22 and the mask 25, however the mask 25 can also be arranged directly on top of the surface 22. The patterned mask 25 comprises apertures 26 having a desired shape, such as a rounded or circular shape, and even having shapes such as a triangular shape, star shape, rectangular shape, or other shape. In one version, a suitable patterned mask 25 comprises substantially round apertures 26 having a diameter of from about 0.508 mm (0.020 inches) to about 3.81 mm (0.150 inches) and spaced apart at a distance of from about 1.02 mm (0.040 inches) to about 5.08 mm (0.200 inches.) The patterned mask 25 can comprise a metal material, such as for example stainless steel, and can be patterned by methods including chemical etching and laser ablation.

A material that is sprayed through the apertures 26 deposits on regions of the surface 22 that are at least partially aligned with the apertures 26 in the patterned mask 25. The accumulation of the deposited material on the regions of the surface 22 forms raised features 23a, thereby providing a textured surface 22. Because the raised features 23a arise from the accumulation of mounds of material on the surface 22, the raised features 23a can comprise smooth and rounded corners and edges, such as rounded top corners 28 and even rounded bottom corners 35. Materials suitable to be sprayed through the mask 25 to form the raised features 23a can comprise for example a metal, such as at least one of titanium, stainless steel, copper, tantalum, tungsten, and aluminum. The material sprayed through the mask 25 can also comprise a ceramic material, such as at least one of aluminum oxide, aluminum nitride, silicon nitride, silicon oxide, quartz, silicon carbide, yttrium oxide, zirconium oxide and titanium oxide, and mixtures of these such as a combination of aluminum oxide and titanium oxide.

The raised features 23a can be formed by spraying methods, such as for example, twin wire arc spraying, thermal spraying, plasma spraying, combustive powder spraying, high velocity oxygen fuel spraying, detonation spraying, or other similar methods. A spraying method may comprise providing a sprayer 44 that at least partially liquefies particles 42 of material. The sprayer 44 propels the liquefied material towards the surface 22, for example with a pressurized gas, to deposit the material on the surface 22. The molten particles 42 impinge on the surface 22 of the underlying structure 24, where they cool and condense to form a solidified material. An example of a spraying process comprising a twin-wire arc spraying process is described, for example, in U.S. Pat. No. 6,227,435 B1, issued on May 8, 2001 to Lazarz et al, and U.S. Pat. No. 5,695,825 issued on Dec. 9, 1997 to Scruggs, both of which are incorporated herein by reference in their entireties.

A predetermined size and shape of the raised features 23a can be provided by selecting parameters of the spraying process. For example, the distance d between the bottom surface of the mask 25 and the surface 22 of the component can be selected to "focus" the spray of material onto the surface 22 to provide raised features 23a having desired widths. Raised features 23a comprising a larger width can be formed when the distance d between the mask 25 and the surface 22 is increased, and a smaller width can be formed when the distance d between the mask 25 and the surface 22 is decreased. The distance d can also be changed during the spraying process to provide raised features 23a having changing widths, such as for example tapering sidewalls 33, as in the raised features 23a shown in FIG. 1. A suitable distance between the patterned mask 25 and surface 22 may be, for example, from about 0.253 millimeters (10 mils) to about 6.35 millimeters (250 mils.)

Other spraying parameters such as the angle of the sprayer 44 with respect to the surface 22, the sizes of the particles propelled towards the surface 22, the pressure of a pressurized gas used to propel the particles, the temperature of the particles, and other parameters can be selected to provide predetermined shapes and sizes of the raised features 23a formed on the surface 22. In one version, the spraying parameters of a twin wire arc spraying process that are selected to form features 23a comprising aluminum include: an angle with respect to the surface 22 of from about 45 degrees to about 90 degrees; a pressure of the pressurized gas of from about 138 kPa (20 PSI) to about 414 kPa (60 PSI); a voltage applied to the sprayer 44 of from about 25 Volts to about 50 Volts; a temperature of the molten particles of at least about 600° C. and even up to about 3000°; a distance between the sprayer 44 and the surface 22 of from about 5.08 cm (2 inches) to about 25.4 cm (10 inches); and a distance between the mask 25 and the surface 22 of from about 0.0254 cm (0.010 inches) to about 2.54 cm (1.00 inches.) The spraying parameters may be selected to provide raised features 23a having a width at the midpoint 39 along the height of the features 23a of from about 0.127 mm (0.005 inches) to about 1.02 mm (0.040 inches), and a distance between the features 23a of from about 0.508 mm (0.020 inches) to about 3.18 mm (0.125 inches.)

Once the textured surface 22 having the features 23 has been formed, the surface can be cleaned to remove any particles remaining from the texture formation processes. A cleaning process can comprise immersing the surface 22 in an ultrasonic cleaning bath having warm de-ionized water, and drying the surface 22 in an oven to bake off any remaining volatile residues.

Figure 6A:
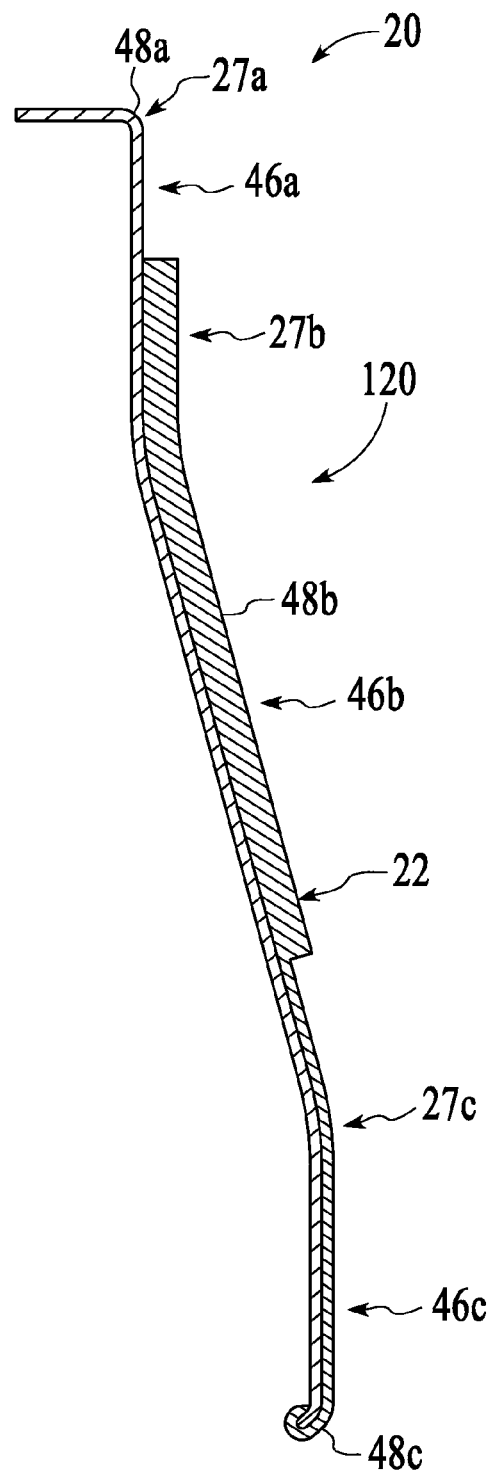
FIG. 6a is a sectional side view of an embodiment of a process chamber component having a pattern of raised features that varies over the surface of the component.
Figure 6B:
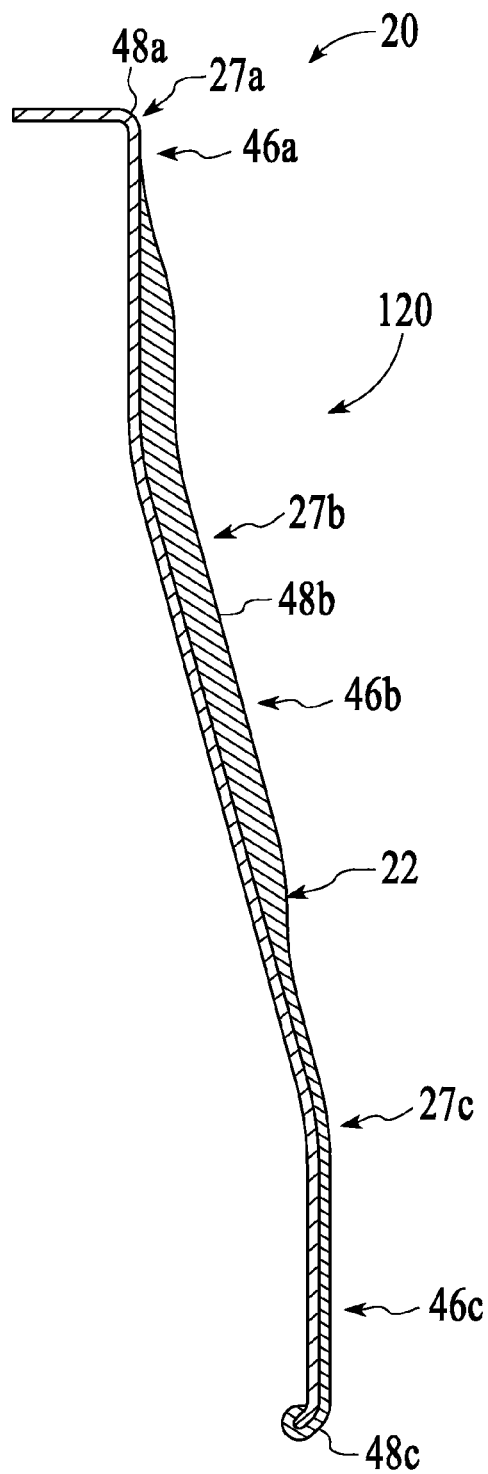
FIG. 6b is a sectional side view of another embodiment of a process chamber component having a pattern of raised features that varies substantially continuously over the surface of the component.

In one version, one or more of the methods described above can be performed to fabricate a textured surface 22 having a predetermined pattern 27 of raised features 23a that varies over the surface of the component 20, to provide an optimum surface for the adhesion of process residues, as shown for example in FIGS. 6a and 6b. For example, the component 20 may have a pattern 27 that varies from a first pattern 27a in a first region 46a of the component surface 22, to a second pattern 27b in a second region 46b of the component surface 22. The first pattern 27a may vary from the second pattern 27b by, for example, having at least one of a different height of the raised features 23a in the region, a different width of the features 23a, and a different spacing between the features. In one version, the component 20 may comprise a first region 46a having a relatively "fine" pattern, such as a pattern of raised features 23a having smaller heights and widths, and even having a smaller spacing between the raised features 23a. A second region 46b on the surface 22 of the component 20 may comprise a relatively "coarse" pattern, such as a pattern 27 of raised features 23a having at least one dimension that is larger than the corresponding dimension in the first region, including at least one of a larger height of the features 23a, a larger width, and a larger spacing between features 23a. In one version, the first and second regions 46a,b comprise substantially discrete regions in which the pattern of features varies abruptly at the boundaries of the regions, as shown for example in FIG. 6a. In another version, the pattern varies smoothly across the regions 46a,b to provide continuously variable texturing of the surface 22 without discrete boundary regions between the regions 46a,b, as shown for example in FIG. 6b. For example, the pattern in one region may smoothly transition to another pattern across from about 10% to about 40% of each region 46a,b.

FIGS. 6a and 6b shows embodiments of components 20 having a pattern 27 of features 23 that varies over the surface 22 of the component 20. In FIG. 6a, a component 20 comprising a shield 120 comprises a first region 46a located near the top 48 of the shield 120 that comprises a relatively "fine" first pattern 27a of features 23a having smaller feature widths and heights. A second region 46b located about the midpoint 48b of the shield 120 comprises a relatively "coarse" second pattern 27b having features 23a with larger widths and heights than those in the first region 46a. The component 20 having the first and second regions 46a,b provides improved adhesion of process residues, because the patterns of features in each region is selected according to the type and quantity of residue that is generated in the area about each shield region. For example, the relatively coarse second pattern can be provided in a region 46b of the shield 120 that is adjacent to the process zone 109 in the process chamber 106 and may also be relatively close to a sputtering target 124, and thus can experience the deposition of relatively large quantities and large particles of process residues onto the region. The coarse second pattern 27b provides a highly textured surface that can collect and provide good adhesion to the large amounts of residue generated in this area.

The relatively fine first pattern 27a can be provided in a region 46a of the shield 129 that is a further away from the process zone 109, and even from the target 124, by virtue of the shield 120 being angled outwardly towards the top 48a of the shield 120. Thus, the "fine" first pattern 27a accommodates the relatively lower amounts and finer sizes of residue that can be generated in this area. The component 20 may further comprise a third region 46c located towards the bottom 48c of the shield 120 having a third pattern 27c of features 23a that is in between the "fine" first pattern 27a and "coarse" second pattern 27b, and thus has feature heights and widths that are in a range between the patterns. Accordingly, the component 20 having the pattern of features 23a that varies across the surface 22 of the component provides improved results by improving the adhesion of residues to the surface 22 of the component 20.

In one version, the varying pattern 27 of raised features 23a is formed by providing a mask 25 having a pattern of apertures 26 that vary in aperture size and/or spacing across the mask 25 to form different patterns of features in different regions of the component surface 22. In another version, the varying pattern 27 is formed by providing multiple masks 25 that each have different patterns of apertures 26 on different regions of the component surface 22. In yet another version, the varying pattern 27 is formed by varying the process conditions maintained during the surface texturing process at different regions on the surface 22. Other methods that form varying feature patterns at different regions on the surface may also be performed.

In one version of a shield 120 having the pattern 27 of raised features 23a that varies over the surface 22 of the shield 120, the first region 46a comprises a first pattern 27a comprising feature widths of, for example, from about 0.127 mm (0.005 inches) to about 0.381 mm (0.015 inches), such as about 0.254 mm (0.010 inches), and feature heights of from about 0.127 mm (0.005 inches) to about 0.381 mm (0.015 inches), such as about 0.254 mm (0.010 inches.) The second region 46b can comprise a second pattern 27b having features 23a with widths that are at least about 8 times and even at least about 10 times the widths of the features 23a in the first region 46a, and heights that are at least about 10 times and even at least about 15 times the heights of the features 23a in the first region 46a. A suitable second pattern 27b may comprise, for example, features 23 having widths of from about 1.27 mm (0.050 inches) to about 3.81 mm (0.150 inches), such as about 2.54 mm (0.100 inches), and heights of from about 2.54 mm (0.100 inches) to about 5.08 mm (0.200 inches), such as about 3.81 mm (0.150 inches.) The third region 46c may comprise a third pattern 27c having features 23a with widths and heights that are at least about 3 times, and even at least about 5 times the widths and heights of features in the "fine" first region 46a, and less than about three quarters and even less than about half the size of the features 23a in the second "coarse" region 46b. A suitable third pattern 27c may comprise, for example features 23 having widths of from about 0.254 mm (0.010 inches) to about 2.54 mm (0.100 inches), such as about 1.27 mm (0.050 inches), and heights of from about 0.254 mm (0.010 inches) to about 2.54 mm (0.100 inches), such as about 1.27 mm (0.050 inches.)

An example of a suitable process chamber 106 having a component 20 with the textured surface 22 is shown in FIG. 5. The chamber 106 can be a part of a multi-chamber platform (not shown) having a cluster of interconnected chambers connected by a robot arm mechanism that transfers substrates 104 between the chambers 106. In the version shown, the process chamber 106 comprises a sputter deposition chamber, also called a physical vapor deposition or PVD chamber, that is capable of sputter depositing material on a substrate 104, such as one or more of tantalum, tantalum nitride, titanium, titanium nitride, copper, tungsten, tungsten nitride and aluminum. The chamber 106 comprises enclosure walls 118 that enclose a process zone 109 and that include sidewalls 164, a bottom wall 166 and a ceiling 168. A support ring 130 can be arranged between the sidewalls 164 and ceiling 168 to support the ceiling 168. Other chamber walls can include one or more shields 120 that shield the enclosure walls 118 from the sputtering environment.

The chamber 106 comprises a substrate support 114 to support the substrate in the sputter deposition chamber 106. The substrate support 114 may be electrically floating or may comprise an electrode 170 that is biased by a power supply 172, such as an RF power supply. The substrate support 114 can also comprise a moveable shutter disk 133 that can protect the upper surface 134 of the support 130 when the substrate 104 is not present. In operation, the substrate 104 is introduced into the chamber 106 through a substrate loading inlet (not shown) in a sidewall 164 of the chamber 106 and placed on the support 114. The support 114 can be lifted or lowered by support lift bellows and a lift finger assembly (not shown) can be used to lift and lower the substrate onto the support 114 during transport of the substrate 104 into and out of the chamber 106.

The support 114 may also comprise one or more rings, such as a cover ring 126 and a deposition ring 128 that cover at least a portion of the upper surface 134 of the support 114 to inhibit erosion of the support 114. In one version, the deposition ring 128 at least partially surrounds the substrate 104 to protect portions of the support 114 not covered by the substrate 104. The cover ring 126 encircles and covers at least a portion of the deposition ring 128, and reduces the deposition of particles onto both the deposition ring 128 and the underlying support 114.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to from a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 106 through an exhaust 122 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104, and comprising material to be sputtered onto the substrate 104, such as for example at least one of tantalum and tantalum nitride. The target 124 can be electrically isolated from the chamber 106 by an annular insulator ring 132, and is connected to a power supply 192. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 5, the shield 120 has an upper section 120a mounted to the support ring 130 and a lower section 120b that is fitted to the cover ring 126. A clamp shield 141 comprising a clamping ring can also be provided to clamp the upper and lower shield sections 120a,b together. Alternative shield configurations, such as inner and outer shields, can also be provided. In one version, one or more of the power supply 192, target 124 and shield 120, operate as a gas energizer 116 that is capable of energizing the sputtering gas to sputter material from the target 124. The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104. The support 114 having the electrode 170 and support electrode power supply 172 may also operate as part of the gas energizer 116 by energizing and accelerating ionized material sputtered from the target 124 towards the substrate 104. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the substrate support 114 and substrate transport to position a substrate 104 in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, the features 23 can be formed on the surface 22 by means other than those specifically described. Also, the surface 22 may comprise materials other than those described. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A method of fabricating a process chamber component, the method comprising:
    (a) providing a process chamber component having a surface;
    (b) forming a patterned resist layer on the process chamber component, the patterned resist layer having apertures that expose portions of the surface of the process chamber component therethrough;
    (c) forming a textured surface having raised features on the process chamber component by etching the exposed portions of the surface of the process chamber component through the apertures;
    (d) removing the patterned resist layer; and
    (e) electrochemically graining the raised features to erode material from the top corners, thereby forming top corners that are rounded.

2. A method according to claim 1 wherein the patterned resist layer comprises a photoresist material, and wherein (b) comprises scanning a laser beam across a surface of the resist layer and developing the resist layer to form the apertures.

3. A method according to claim 1 wherein (b) comprises ablating the patterned resist layer to form apertures in the layer by directing a laser beam onto the resist layer.

4. A method according to claim 1 wherein the patterned resist layer comprises at least one of a polymer, metal or ceramic material.

5. A method according to claim 1 wherein the surface of the process chamber component comprises at least one of titanium, stainless steel, copper, tantalum, tungsten and aluminum.

6. A method according to claim 1 wherein the surface of the process chamber component comprises at least one of aluminum oxide, aluminum nitride, silicon nitride, silicon oxide, quartz, silicon carbide, yttrium oxide, zirconium oxide and titanium oxide.

7. A method according to claim 1 wherein (a) comprises providing a process chamber component comprises one of a chamber enclosure wall, chamber shield, target, cover ring, deposition ring, support ring, insulator ring, coil, coil support, shutter disk, clamp shield or substrate support.

8. A method according to claim 1, wherein electrochemically graining the raised features to erode material from the top corners, thereby forming top corners that are rounded comprises immersing the raised features in an electrochemical graining solution comprising HCl, and applying an alternating current to provide a current density of from about 807 Amps/m$^2$ to about 2691 Amps/m$^2$.

* * * * *